(12) United States Patent
Cain

(10) Patent No.: US 7,947,612 B2
(45) Date of Patent: May 24, 2011

(54) ELECTRONIC DEVICE ARRAY

(75) Inventor: Paul A. Cain, Cambridge (GB)

(73) Assignee: Plastic Logic Limited, Cambridge (GB)

( * ) Notice: Subject to any disclaimer, the term of this patent is extended or adjusted under 35 U.S.C. 154(b) by 319 days.

(21) Appl. No.: 11/793,294

(22) PCT Filed: Dec. 16, 2005

(86) PCT No.: PCT/GB2005/004903
§ 371 (c)(1),
(2), (4) Date: Nov. 2, 2007

(87) PCT Pub. No.: WO2006/064275
PCT Pub. Date: Jun. 22, 2006

(65) Prior Publication Data
US 2008/0188092 A1      Aug. 7, 2008

(30) Foreign Application Priority Data

Dec. 16, 2004   (GB) ................................... 0427563.2

(51) Int. Cl.
*H01L 21/00* (2006.01)
(52) U.S. Cl. ............... 438/798; 438/151; 257/E21.347; 257/E21.475
(58) Field of Classification Search ................... 438/149, 438/151, 795, 798, 940, FOR. 418, FOR. 419; 257/E21.347, E21.475
See application file for complete search history.

(56) References Cited

U.S. PATENT DOCUMENTS

| 6,013,928 | A | * | 1/2000 | Yamazaki et al. | ............ | 257/347 |
| 6,248,634 | B1 | * | 6/2001 | Hayama et al. | ............... | 438/279 |
| 6,362,509 | B1 | | 3/2002 | Hart | | |
| 6,465,285 | B2 | * | 10/2002 | Tokuhiro et al. | .............. | 438/153 |
| 2003/0160235 | A1 | * | 8/2003 | Hirai | ............................... | 257/40 |
| 2004/0212047 | A1 | | 10/2004 | Joshi et al. | | |
| 2005/0009248 | A1 | * | 1/2005 | Weng et al. | ................... | 438/149 |

FOREIGN PATENT DOCUMENTS

| WO | WO 98/03271 A | 1/1998 |
| WO | WO 2004/047144 A2 | 6/2004 |
| WO | WO 2004/079833 A1 | 9/2004 |
| WO | WO 2005/022664 A2 | 3/2005 |

OTHER PUBLICATIONS

European Examination Report dated Jan. 12, 2009.
Chinese Office Action dated Apr. 28, 2010, corresponding to Chinese Application No. 200580047427.6, English Language Translation.

* cited by examiner

*Primary Examiner* — Matthew S Smith
*Assistant Examiner* — Quovaunda Jefferson
(74) *Attorney, Agent, or Firm* — Sughrue Mion, PLLC

(57) ABSTRACT

A method of producing an array of electronic devices, the method including the steps of: forming one or more first conductive elements of a first electronic device on a substrate and one or more second conductive elements of a second electronic device on said substrate; and forming a layer of channel material over the substrate and the first and second conductive elements to provide a first channel for, in use, the movement of charge carriers between conductive elements of said first electronic device and a second channel for, in use, the movement of charge carriers between conductive elements of said second electronic device; wherein the method also includes the step (a) of using an irradiative technique to decrease in a single step the conductivity of one or more selected portions of the layer of channel material in one or more regions between the first and second conductive elements.

24 Claims, 9 Drawing Sheets

ELECTRONIC DEVICE ARRAY

The present invention relates to a technique of producing an array of electronic devices, particularly but not exclusively to a method of patterning a semiconductor layer in the production of an array of electronic devices, such as semiconducting polymer thin-film transistors (TFTs).

Semiconducting conjugated polymer thin-film transistors (TFTs) have recently become of interest for applications in cheap logic circuits integrated on plastic substrates (C. Drury, et al., APL 73, 108 (1998)) and optoelectronic integrated devices and pixel transistor switches in high-resolution active-matrix displays (H. Sirringhaus, et al., Science 280, 1741 (1998), A. Dodabalapur, et al. Appl. Phys. Lett. 73, 142 (1998)). In test device configurations with a polymer semiconductor, inorganic metal electrodes and gate dielectric layers high-performance TFTs have been demonstrated. Charge carrier mobilities up to 0.1 $cm^2/Vs$ and ON-OFF current ratios of $10^6$-$10^8$ have been reached, which is comparable to the performance of amorphous silicon TFTs (H. Sirringhaus, et al., Advances in Solid State Physics 39, 101 (1999)).

Thin, device-quality films of conjugated polymer semiconductors can be formed by coating a solution of the polymer in an organic solvent onto the substrate. The technology is therefore ideally suited to cheap, large-area solution processing compatible with flexible, plastic substrates.

Organic TFT applications can be prone to current leakage between elements within a device, such as charged pixels and logic gate elements. For many TFT applications the active semiconducting layer therefore needs to be isolated between devices. This is necessary in order to reduce electrical crosstalk and eliminate parasitic leakage currents between neighbouring devices. Even if the semiconducting material is not doped, leakage currents through the semiconducting layer can be significant, in particular for circuits with a high packing density of transistors, such as high resolution active matrix displays.

In an active matrix display, metallic interconnects for pixel addressing are deposited such that they are positioned across the display. If semiconducting material is present underneath such interconnects lines, then parasitic TFT channels can form within the layers underneath the interconnect lines, giving rise to non-negligible leakage currents between pixels. This leakage can lead to the degradation of device performance. Therefore, if a blanket unpatterned layer of semiconductor is coated over the entire panel, patterning of the layer is required.

The semiconductor may be deposited in this form by spin-coating of a solution-processable semiconductor, such as F8T2, or the evaporative deposition of other semiconductors, such as pentacene. However, even undoped semiconducting layers in both of the above mentioned cases, the semiconductor material between elements within the device and areas underneath gate interconnects will be electrically active when the gate is activated.

Ideally, the patterning method for the semiconductor should be digital to allow for distortion correction over a large area panel, for example, in making large flexible displays. As a result, processes such as shadow masking for the application of semiconductors, such as pentacene are unsuitable for large area semiconductor patterning, as no distortion correction is possible for a given mask.

One way of patterning solution-processable semiconductors is to ink-jet print the semiconductor only where it is needed, for example, directly over the channel region of a transistor. This is an example of a digital process and has the added advantage of efficient use of the semiconductor material. The ultimate resolution achievable with such a process may be limited due to the spreading of a drop of deposited semiconductor on the substrate surface. Another problem with such a process is that the spreading of the drops are determined by the surface onto which it is printed, and so the substrate material cannot easily be changed without considering the repercussions on the semiconductor patterning step. This reduces the choice of substrates available. Other direct-write printing techniques for patterning of semiconducting layers from solution, such as offset or screen printing entail similar issues.

Photolithography can also be used for patterning of the active semiconductor layer (Gerwin. H. Gelinck. et. al., Nature Materials 3, 106-110 (2004)). However, photolithography requires several process steps, can lead to degradation of the organic semiconductor material due to chemical interactions between the semiconductor and the resist chemicals/solvents, and is difficult to perform on a dimensionally unstable flexible substrate, particularly, when high registration accuracy with previously deposited patterns is required over a large substrate area. For example, U.S. Pat. No. 6,803,267 describes a method of fabricating an organic memory device involving a multi-step technique for patterning an organic semiconductor material. The multi-step technique involves depositing a silicon-based resist over the organic semiconductor, irradiating portions of the silicon-based resist, patterning the silicon-based resist to remove the irradiated portions of the silicon-based resist, patterning the exposed organic semiconductor, and stripping the non-irradiated silicon-based resist.

It is an aim of the present invention to provide an alternative method for patterning the channel material in the production of an array of electronic devices which at least partially solves the above-mentioned problems.

According to a first aspect of the present invention, there is provided a method of producing an array of electronic devices, the method including the steps of: forming one or more first conductive elements of a first electronic device on a substrate and one or more second conductive elements of a second electronic device on said substrate; and forming a layer of channel material over the substrate and the first and second conductive elements to provide a first channel for, in use, the movement of charge carriers between conductive elements of said first electronic device and a second channel for, in use, the movement of charge carriers between conductive elements of said second electronic device; wherein the method also includes the step (a) of using an irradiative technique to decrease in a single step the conductivity of one or more selected portions of the layer of channel material in one or more regions between the first and second conductive elements.

In one embodiment, step (a) includes using an irradiative technique to remove in a single step said one or more selected portions of the layer of channel material to thereby reduce the conductivity of said one or more selected portions without irradiating any portions of the layer of channel material overlying the first and second conductive elements.

In one embodiment, the channel material is a semiconductor material.

In one embodiment, step (a) includes using said irradiative technique to locally generate heat in the one or more selected portions of the layer of channel material in between first and second conductive elements and/or respective portions of the substrate underlying said one or more selected portions of the layer of channel material, wherein said heat induces a photo-thermal and/or photochemical denaturing process of the channel material and acts to reduce the conductivity of said one or more selected portions of the layer of channel material.

In one embodiment, said step (a) involves ablating said portions of the channel material using ultraviolet laser radiation.

In one embodiment, said one or more selected portions in step (a) include one or more lines extending substantially perpendicular to a direction between said first and second conductive elements.

In one embodiment, the method includes forming a pair of first conductive elements and a pair of second conductive elements on the substrate; and wherein the layer of channel material provides said first channel between said pair of first conductive elements, and said second channel between said pair of second conductive elements.

In one embodiment, said selected portions of said layer of channel material are spaced from said first and second channel by more than 10 micrometers, particularly more than 50 micrometers.

In one embodiment, said selected portions of said layer of channel material are spaced from said first and second conductive elements by more than 10 micrometers, particularly more than 50 micrometers.

In one embodiment, the first pair of conductive elements forms the source and drain electrodes of a first field effect transistor device; and the second pair of conductive elements form the source and drain electrodes of a second field effect transistor device.

In one embodiment, said one or more selected portions in step (a) include a series of at least two lines extending continuously under a gate line.

In one embodiment, the method further includes the steps of (b) forming a dielectric layer over the substrate, the first and second conductive elements and the layer of channel material and (c) forming a gate line extending over each of the first and second channels.

In one embodiment, the field effect transistors are normally-off field effect transistor devices, and said one or more selected portions of step (a) include portions underlying a gate line.

In one embodiment, said one or more selected portions in step (a) include a series of at least two lines extending continuously under a gate line.

In one embodiment, said gate line has a width, and the one or more selected portions of step (a) include one or more lines extending at least the width of said gate line.

In one embodiment, the first and second electronic devices are normally-on field effect transistor devices, and said one or more selected portions of step (a) include (i) portions underlying said gate line and (ii) portions not underlying said gate line.

In one embodiment, the one or more first conductive elements include a pixel electrode having a number of sides, and wherein the one or more selected portions in step (a) include one or more lines extending along each of the sides of the pixel electrode.

In one embodiment, step (a) includes focussing one or more laser beams to one or more points located in said one more selected portions of the layer of channel material or respective portions of the substrate underlying said one or more selected portions.

In one embodiment, the selected portions of said layer of channel material do not form a closed path around the first and/or second electronic devices.

In one embodiment, said step of ablating the channel material also ablates a portion of the material of the substrate.

According to another aspect of the present invention, there is provided an array of electronic devices comprising at least one first and one second electronic device on a substrate, each of the first and second electronic devices including a patterned layer of channel material, wherein said patterned layer of channel material also defines, in use, one or more conduction paths between the first and second electronic devices, but wherein the pattern of said layer of channel material is configured such that the shortest conduction path between said first and second electronic devices, is longer by a factor of at least 50% than the shortest physical distance between said first and second electronic devices.

According to another aspect of the present invention, there is provided an array of electronic devices comprising at least one first and one second electronic device on a substrate, each of said first and second electronic devices including a patterned layer of channel material; and the first electronic device including a gate electrode that overlies at least a portion of said patterned layer of channel material and also extends over a portion of the second electronic device; wherein the patterned layer of channel material defines, in use, one or more conduction paths between said first and second electronic devices, but wherein at least a portion of each of said one or more conduction paths runs through a region of said patterned layer of channel material over which said gate electrode is not present.

In one embodiment, said pattern of channel material is defined by laser ablation of the channel material, and wherein said step of laser ablation is carried out without ablating any portions of the layer of channel material overlying conductive elements of said first and second electronic devices which were predefined on the substrate.

According to another aspect of the present invention, there is provided a display or memory device including an array of electronic devices as described above. The array of electronic devices may include as little as two devices, but on the other hand may include an ordered array of hundreds or thousands of devices.

In one embodiment, laser ablation is used to form trenches within a semiconductor layer and even within a substrate surface on which the semiconductor layer is formed.

In many cases the substrate onto which the semiconducting layer is deposited already contains a pattern of metal electrodes, such as for example an array of electrodes or interconnects. A process of laser patterning semiconductor material that is in direct contact with the layer of conductive material can be challenging, as the process window is defined by the ablation threshold difference between the conductive material and the semiconductor material. The ablation threshold for the conductive material may be similar to that of the semiconductor material at a given laser wavelength (UV): Therefore a situation may arise where little or no process window exists. This is a particularly important issue on a flexible substrate, for which also the substrate can be ablated, and for which the adhesion of the conductive material to the substrate may not be very strong. In such cases the conductive layer is removed from the substrate together with the semiconducting layer during the ablation step leading to breaks in the conductive lines. In one embodiment of the present invention, the semiconductor is ablated only in those places where the semiconductor is in direct contact with the insulating substrate material, as opposed to those areas where the semiconductor is in contact with the conductive layer. A critical gap of unpatterned semiconductor is left in the vicinity of a feature of the underlying conductive layer. Electrically, the partial isolation approach does not need to cause any isolation issues, as those regions where the semiconductor material is in direct contact with the conductive layer are electrically shorted along the line of the conductive material.

Embodiments of the present invention involve techniques and designs by which very efficient suppression of leakage currents can be achieved in spite of the only partial isolation of the semiconducting active layer islands, and leakage currents flowing through the unpatterned regions of the semiconductor in the vicinity of the conductive electrodes can be minimized.

With embodiments of the present invention, laser-induced degradation of the electrical properties of devices that use the semiconducting material remaining on the substrate after the ablation as active layer can be avoided.

Embodiments of the present invention allow excellent suppression of leakage current between the elements within the device, resulting in a high resolution, high throughput digital process. In addition, distortion correction techniques may be applied, allowing large areas to be processed. It allows directwrite patterning of the semiconductor layer without requiring additional process steps.

Embodiments of the present invention involve patterning a semiconductor device through a process of laser ablation in order to isolate a device and eliminate electrical crosstalk and parasitic leakage currents between neighbouring devices.

One embodiment of the present invention involves laser ablating the material of the semiconducting layer, in order to isolate neighbouring devices.

One embodiment of the present invention involves ablating the semiconductor material and also the substrate material if required, but keeps a minimum distance to any underlying conductive layers.

Another embodiment of the invention involves ablating the semiconductor material and also the substrate material if required, but keeps a minimum distance to any active device region.

Yet another embodiment of the invention involves ablating the semiconductor material only in those regions of the substrate which are located underneath a subsequently deposited electrode.

One embodiment involves patterning an organic semiconducting material. The layer of semiconductor material may be patterned by choosing a substrate that absorbs at the desired laser wavelength to ablate the semiconductor material. Upon exposure to a laser beam, substrate material is ablated in the exposed regions. This results in the removal of the irradiated substrate material and the semiconducting material in the regions directly above in the overlying layer. In this case, there is no limit on the type of semiconducting material that may be chosen.

To help understanding of the invention, a specific embodiment thereof will now be described by way of example only and with reference to the accompanying drawings, in which:

FIG. 8 shows further examples of patterning a semiconductor layer according to further embodiments of the present invention; the minimum lateral separation between the semiconductor trench and the source or drain electrodes shown in FIG. 8b is less than half that of the lateral separation shown in FIG. 8a.

Figure 1:
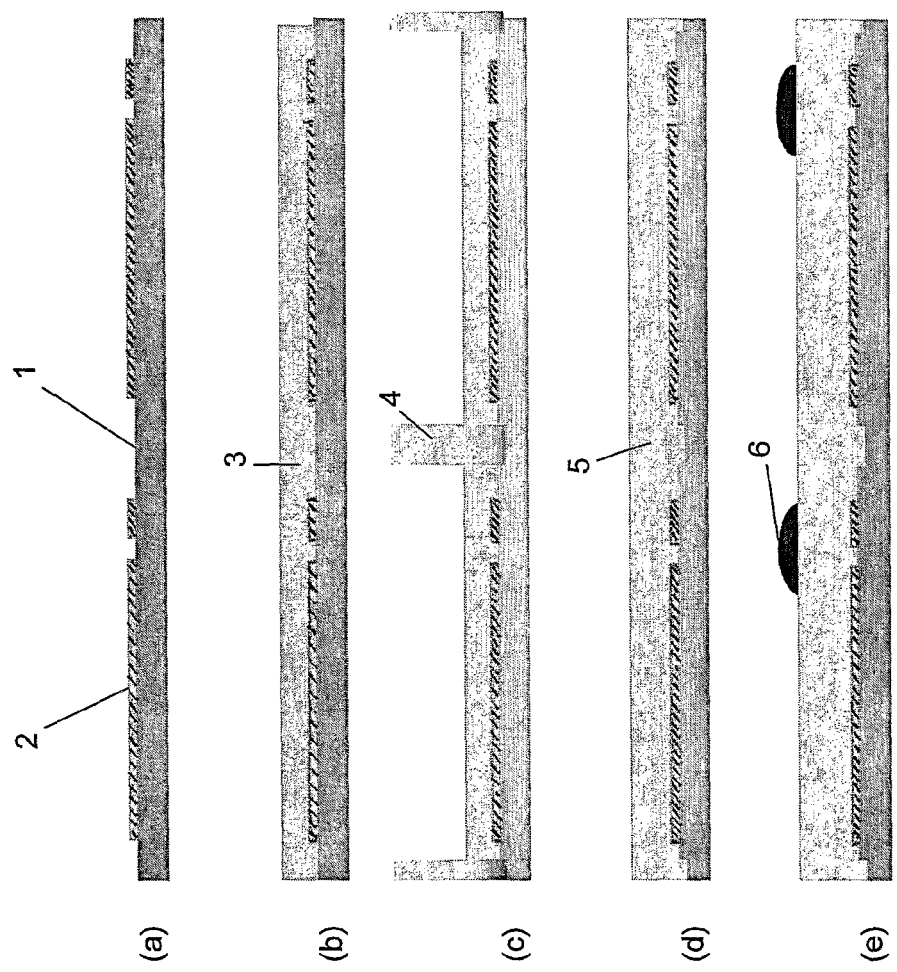
FIG. 1 illustrates a method of isolating a device by patterning semiconductor material using a method of laser ablation according to an embodiment of the present invention.

With reference to the drawings, a first embodiment of the present invention is illustrated in FIG. 1 in the context of an array of top-gate TFT for applications such as active matrix displays. In order to produce an electronic device with an optimal display front-of-screen performance using an organic semiconducting material for the TFT it is necessary to pattern the material of the semiconducting layer and isolate neighbouring devices. This is achieved by a process of laser patterning. This process is used to ablate the semiconductor material, and also the substrate material if required, only in those places where there is no underlying conductive sourcedrain layer. In this way parasitic TFTs can be removed as the devices are isolated.

A substrate 1 is coated with a thin conductive layer 2. The substrate may be either a rigid substrate such as glass or a flexible substrate, such as a plastic film, including but not limited to polyethyleneterephthalate (PET). A first conductive layer 2, which is preferably an inorganic metallic layer, such as gold, or silver is deposited. Alternatively, an organic conducting polymer such as polyethylenedioxythiophene doped with polystyrene sulfonic acid (PEDOT/PSS) may be used. The conductive layer is deposited using solution processing techniques such as spin, dip, blade, bar, slot-die, or spray coating, inkjet, gravure, offset or screen printing, or by vacuum deposition, such as evaporation or preferably a sputtering technique. The preferred conductive layer is patterned to form source and drain electrodes 2 by a process such as, but not limited to, optical lithography or laser ablation. The conductive layer may also be patterned by a direct-write printing technique such as inkjet printing. For a display application the metallic layer is patterned to form a periodic array of TFT source-drain electrodes, and data interconnects with a pitch in two directions determined by the display resolution.

Once the metallic layer has been patterned to form source and drain electrodes, a layer of semiconducting material 3 may then be deposited over the substrate. The semiconducting material may be a polyarylamine, polyfluorene or polythiophene derivative, such as poly-dioctyllfluorene-co-bithiophene (F8T2) or (poly(9,9'-dioctylfluorene-co-bis-N, N'-(4-butylphenyl)diphenylamine) (TFB)). A broad range of deposition techniques may be used to deposit the semiconducting material including, but not limited to, inkjet printing, soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999

(1997)), offset printing, blade coating or dip coating, curtain coating, meniscus coating, spray coating, or extrusion coating. The semiconductor is preferably spin-coated onto the substrate to give a coating ~50 nm thick after solvent evaporation. In addition, an evaporative process may also be used. Another preferred technique for the present invention is the technique of ink jet printing. If the layer is ink jet printed, a minimum amount of semiconductor material may be used, which is both environmentally and economically advantageous.

Next the active semiconducting layer is patterned to isolate one device from another. This is necessary in order to reduce electrical crosstalk and eliminate parasitic leakage currents between neighbouring devices. The semiconductor layer is patterned using a pulsed laser beam 4 at a wavelength that is absorbed by the layer of semiconducting material, and which may also be absorbed by the substrate if further ablation is required. The semiconducting material is exposed to the laser beam only in the regions in which the metallic layer is not present. This is due to the fact that any exposure to the laser beam of regions containing underlying-metallic material would cause ablation of the metallic material.

The ablation occurs by focusing a 248 nm KrF excimer laser (Lumonics PM800), onto a substrate through a mask pattern to give the required semiconductor pattern, in a step-and-repeat process. In a deliberately overdosing approach, a two-shot process is used, with each shot at a fluence 650 mJ/cm$^2$. In addition, a 308 nm laser beam or other suitable wavelength depending on the absorption characteristics of the semiconducting material may be used. The ablation to the semiconductor material 3 occurs via thermal and stress confinement effects from the localised photon flux. Regions of the substrate 1 may also be ablated during this process, if required. The source and drain electrodes are now electrically isolated with respect to neighbouring source and drain electrodes. This process proceeds with limited amounts of debris being produced.

The semiconductor need not be patterned around the entire perimeter of the pixel for two different reasons.

To pattern the semiconductor material around the entire perimeter would require semiconductor to be patterned over the thin gold line connecting the pixel to the interdigitated TFT region below it. However, this is unnecessary as all of the semiconductor material on top of the gold material would be shorted by the gold. In addition, attempting to pattern the semiconductor over the underlying gold material may remove the gold, destroying the connectivity.

Minimizing the patterning will minimize the debris, which is particularly critical near the interdigitated TFT area.

Subsequently, the gate dielectric layer 5 and gate electrode and interconnects 6 are deposited. A single or a multilayer of dielectric material 5 is deposited onto the substrate over the patterned semiconducting layer. Materials such as polyisobutylene or polyvinylphenol may be used for the dielectric layer, but preferably polymethylmethacrylate (PMMA) and polystyrene are used. The dielectric material may be deposited in the form of a continuous layer, by techniques such as, but not limited to, spray or blade coating. However, preferably, the technique of spray coating is used.

The deposition of the layer of dielectric material is then followed by the deposition of a gate electrode 6 and interconnect lines. The gate electrode may be a printable inorganic nanoparticle of silver or old or a conducting polymer such as PEDOT/PSS. The gate electrode is deposited using techniques such as sputtering or evaporation techniques or solution processing techniques such as spin, dip, blade, bar, slot-die, gravure, offset or screen printing. Preferably, the gate electrode is deposited by ink jet printing.

If the semiconductor device is undoped, or normally-OFF (negative turn-on voltage in the case of a p-type TFT), i.e. does not conduct electricity in any ungated region of the structure, the removal of the semiconductor is primarily required underneath the gate and gate interconnect. This is because when the gate is activated, all of the semiconductor beneath the gate interconnect region becomes conducting and would create unwanted parasitic leakage paths between the charged pixel and other source or drain regions associated with other pixels.

Figure 2:
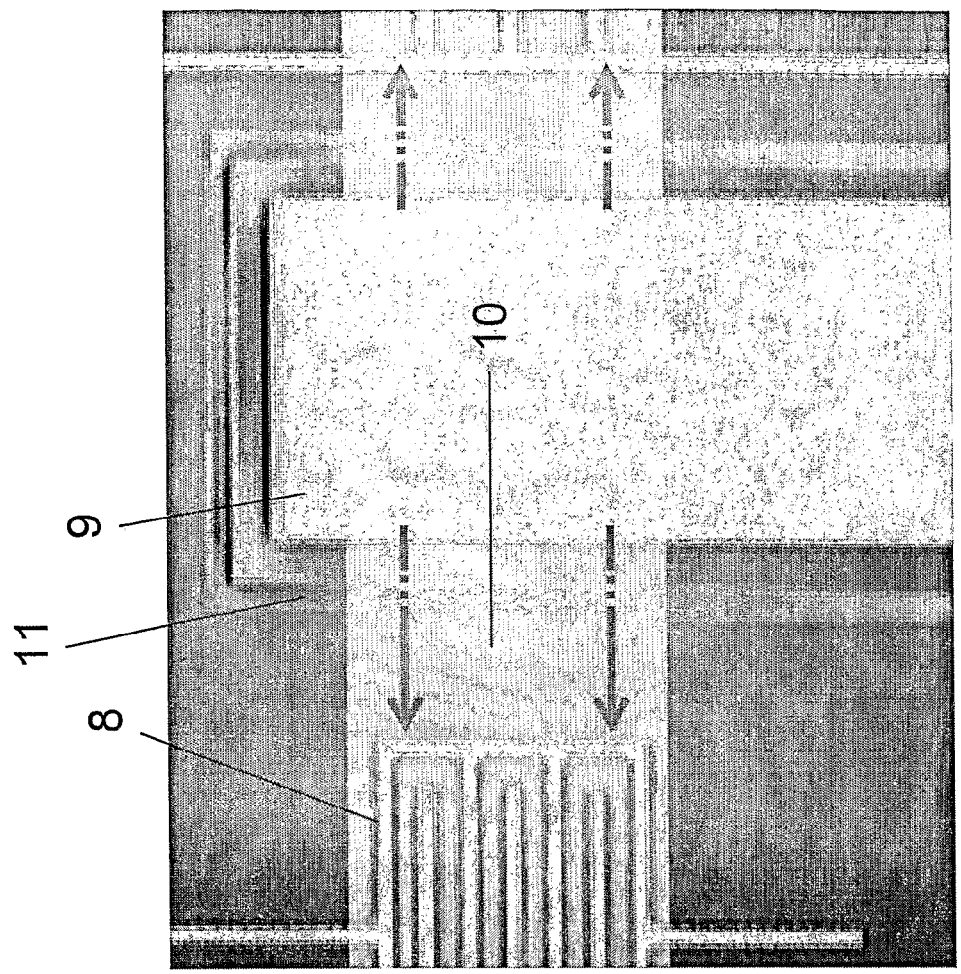
FIG. 2 shows the locations of the unwanted leakage paths that can exist under the gate region in a normally-off device when the gate is activated.
Figure 2:
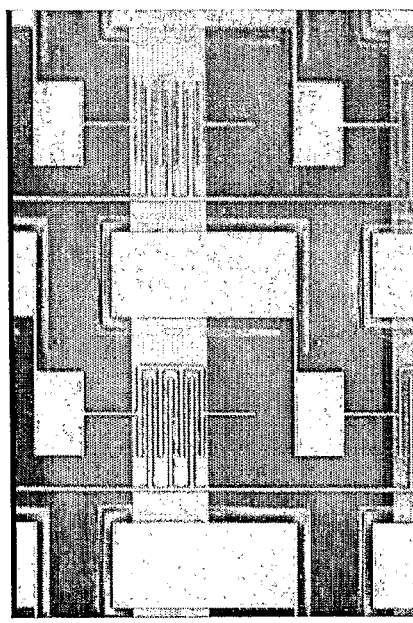

FIG. 2 shows the locations of the unwanted leakage paths that would exist under the gate region when the gate is activated. The dominant leakage between the drain electrode 8 of one TFT and the pixel electrode 9 of a neighbouring pixel would be underneath the gate interconnect 10. It is the semiconductor in these locations for which trench-patterning (11) is most effective to prevent inter-pixel leakage. Patterning the rest of the semiconductor material affords little benefit for a normally-off semiconductor since it is never activated.

For a normally-on (positive turn-on voltage in the case of a p-type TFT) semiconductor device, it is better to pattern as much of the perimeter as possible, without destroying the interconnect between the pixel and the TFT. Taking care to not destroy the interconnect between the pixel and the TFT may result in leaving some leakage paths present from the pixel electrode to other neighbouring TFTs, but the path length of the leakage can be massively increased, therefore reducing the conductance of the path, and therefore, the pixel crosstalk.

Figure 3:
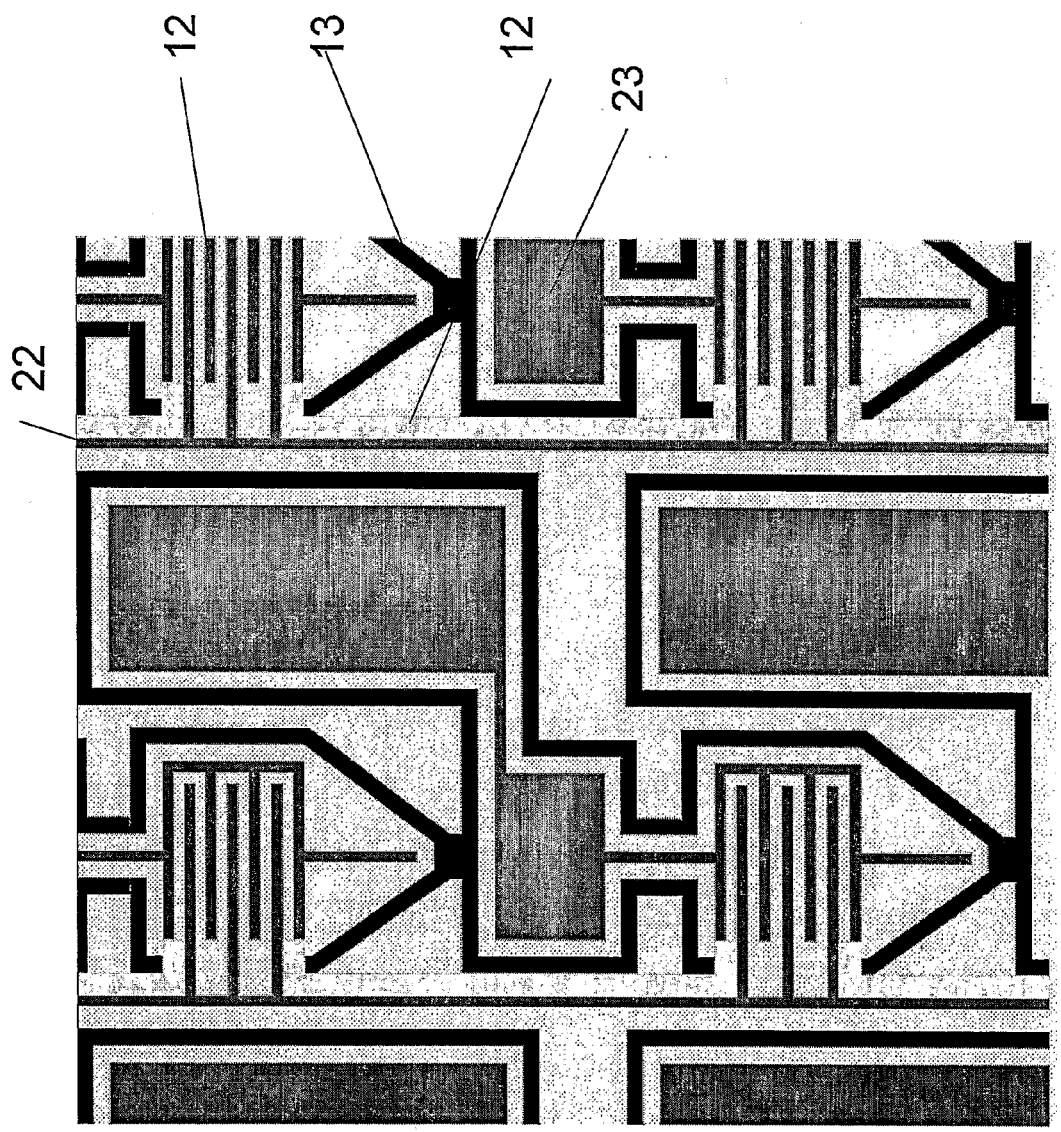
FIG. 3 shows a schematic of a method according to an embodiment of the present invention of patterning semiconducting material around a pixel structure when the semiconductor device is a positive threshold p-type (or negative threshold n-type).

FIG. 3 shows a schematic of a possible patterning method around a pixel structure when the semiconductor device is normally ON, such that current leakage occurs even in ungated regions of the pixel. The metal source-drain/pixel electrode structures 12 are shown, along with the areas where the otherwise blanket semiconductor layer has been removed, 13. If no semiconductor patterning had been performed, it is clear that there would be a large amount of inter-pixel leakage. However, by patterning the semiconductor material as shown, there remains only one leakage path 14 that allows charge to transfer from one pixel 23 to either another pixel electrode or to a source line 22. However, the aspect ratio of this leakage path is such that the conductance of the path is between one and two orders of magnitude lower than in the case of unpatterned semiconductor material. Some current will still be lost from the pixel electrode to the source line (although less than before), but this will not contribute to pixel crosstalk.

The semiconducting material defines conduction paths for charges to leak off the pixel electrode 23 to neighbouring pixel electrodes or neighbouring source lines 22. By patterning the semiconducting material in the way shown in FIG. 3 there is no complete isolation of the active semiconducting material in the channel of a particular transistor from the surrounding device (as one would achieve by removing the semiconducting material from a closed-loop region surrounding any device), i.e. there are still conduction paths between neighbouring devices. This is because in order to avoid degradation of underlying metal patterns during the step of laser ablation a minimum distance of the laser ablated region to any underlying electrode structures needs to be maintained. For photolithographic patterning full isolation of the semiconducting active layer is possible, but for laser ablation this would result in severe damage to metal layers and interconnects predefined in underlying layers. However, the length of such conduction paths between any two transistors is significantly longer than the direct distance between these transistors. Preferably, the step of semiconductor patterning lengthens the conduction path by at least 50%.

Preferably the step of patterning the semiconducting layer causes any such conduction paths to run through regions of the substrate in which no gate electrode or gate-level interconnects are running, i.e. no accumulation layer is formed in such regions of the conduction path resulting in greatly increased resistance of such conducting/leakage path.

In this first embodiment the semiconductor layer and the laser wavelength are chosen such that the semiconducting material strongly absorbs the laser radiation. Preferably, the laser is an ultraviolet laser, such as an excimer laser, absorbed by the individual functional groups of the organic semiconducting material. Alternatively a visible or infrared laser may be used which is absorbed by the $\pi$-$\pi$ band gap transition or by a specific vibrational mode of the organic semiconductor.

Alternatively, in a second embodiment the layer of semiconductor material may be patterned by choosing a substrate that absorbs at the laser wavelength that is used to ablate the semiconductor. Upon exposure to a laser beam, the substrate material is ablated in the exposed regions, and the material in the above lying semiconducting layer above these regions is also removed. In this case, there is no limit on the type of semiconducting material that may be chosen.

According to such second embodiment, a substrate 1 is coated with a thin conductive layer 2. The substrate is chosen such that the laser beam that is used to ablate the layer of semiconductor material is absorbed by the substrate. In particular, plastic substrates may be used which absorb at the wavelengths used during ablation. The substrate may also be coated with an insulating, dielectric overlayer deposited to absorb the laser radiation. Such overlayer may also contain a dye chosen to provide strong absorption at the wavelength of the laser. A first conductive layer 2, which is preferably a inorganic metallic layer, such as gold, or silver is deposited. Alternatively, an organic conducting polymer such as polyethylenedioxythiophene doped with polystyrene sulfonic acid (PEDOT/PSS) may be used. The conductive layer is deposited using solution processing techniques such as spin, dip, blade, bar, slot-die, or spray coating, inkjet, gravure, offset or screen printing, or by vacuum deposition, such as evaporation or preferably a sputtering technique. The preferred conductive layer is patterned to form source and drain electrodes 2 by a process such as, but not limited to, optical lithography or laser ablation. The conductive layer may also be patterned by a direct-write printing technique such as inkjet printing. For a display application the metallic layer is patterned to form a periodic array of TFT source-drain electrodes, and data interconnects with a pitch in two directions determined by the display resolution.

Once the metal layer has been patterned to form source and drain electrodes, a layer of semiconducting material 3 is then deposited over the substrate as is detailed above. However, as the ablation method is now dependent on the substrate that is used and not the semiconductor material, there is no limit on the type of semiconductor that may be deposited. As mentioned above, there are a broad range of printing techniques may be used to deposit the chosen semiconducting material including, but not limited to, inkjet printing, soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999 (1997)), offset printing, blade coating or dip coating, curtain coating, meniscus coating, spray coating, or extrusion coating. Preferably, spin-coated onto the substrate to give a coating ~50 nm thick after solvent evaporation. In addition, an evaporative process may also be used. Another preferred technique for the present invention is an ink jet printing technique. If the layer is ink jet printed, a minimum amount of semiconductor material may be used, which is both environmentally and economically advantageous.

The semiconductor layer is then patterned using a pulsed laser 4 at a wavelength absorbed by the layer of substrate material. The substrate material is exposed to the laser beam only in those regions in which the layer of first conductive material is not present. This is due to the fact that any exposure to the laser beam at regions containing underlying-conductive material would cause metal ablation.

The ablation occurs by focusing a 248 nm KrF (Lumonics PM800) or a 308 nm XeCl excimer laser, onto a substrate through a mask pattern to give the required pattern, in a step-and-repeat process. As a greater range of wavelengths may be used to ablate the substrate material compared to the semiconductor material, there is a greater range of lasers that may be used. In a deliberately overdosing approach, a two-shot process was used with each shot at a fluence 650 mJ/cm$^2$. The laser beam may be focused on the substrate surface. This method ablates the substrate material and the above lying semiconductor material in the same step. The source and drain regions are now isolated with respect to neighboring source and drain electrodes. This process has the advantage that the semiconductor material may easily be changed for another without having to adjust the process parameters for ablation.

Subsequently, the gate dielectric layer 5 and gate electrode and interconnects 6 are deposited. A single or a multilayer of dielectric material 5 is deposited onto the substrate over the patterned semiconducting layer. Materials such as polyisobutylene or polyvinylphenol may be used for the dielectric layer, but preferably polymethylmethacrylate (PMMA) and polystyrene are used. The dielectric material may be deposited in the form of a continuous layer, by techniques such as, but not limited to, spray or blade coating. However, preferably, the technique of spray coating is used.

The deposition of the layer of dielectric material is then followed by the deposition of a gate electrode 6 and interconnect lines. The gate electrode may be a printable inorganic nanoparticle of silver or old or a conducting polymer such as PEDOT/PSS. The gate electrode is deposited using techniques such as sputtering or evaporation techniques or solution processing techniques such as spin, dip, blade, bar, slot-die, gravure, offset or screen printing. Preferably, the gate electrode is deposited by ink jet printing.

Figure 4:
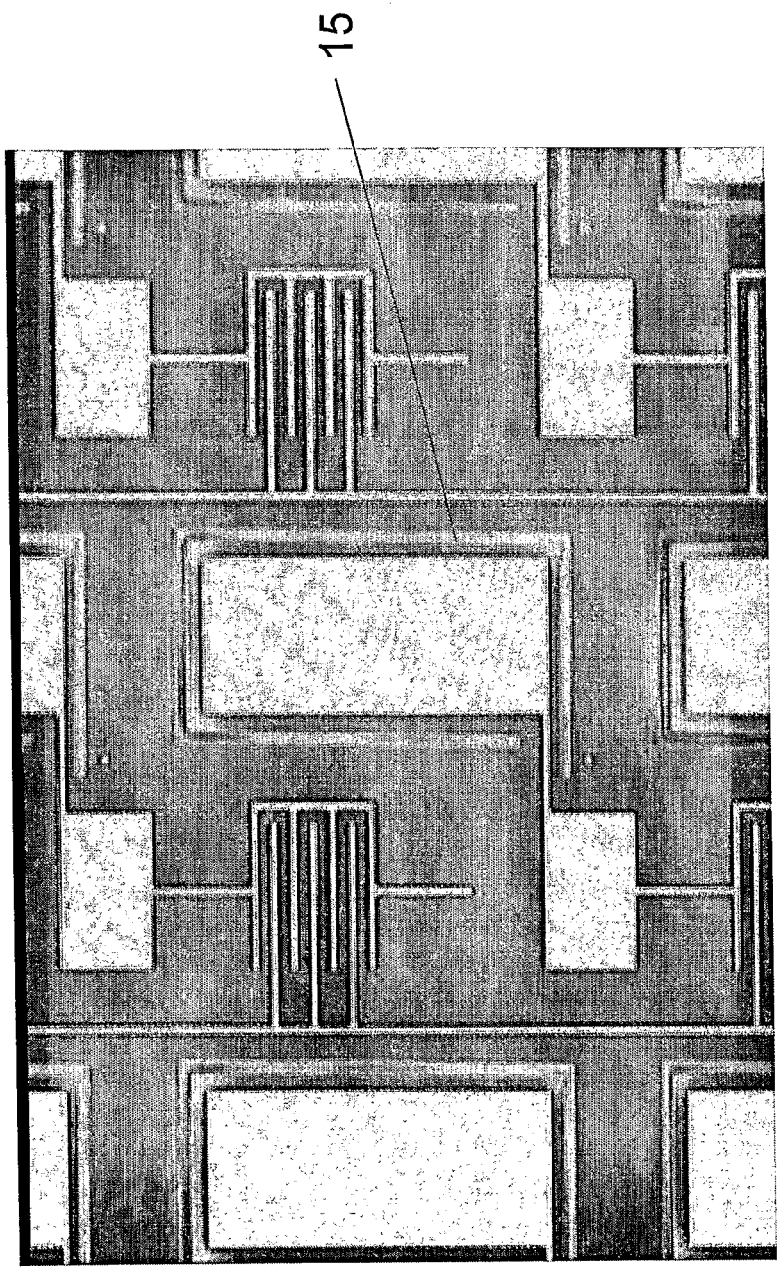
FIG. 4 shows an optical micrograph of the surface profile of a device measured on an atomic force microscope immediately after a semiconductor ablation process according to an embodiment of the present invention.

FIG. 4 shows an optical micrograph of the surface profile of a device measured on an atomic force microscope immediately after the semiconductor ablation process. The optical micrograph shows a laser-ablated trench 15 that has been produced around a device pixel. Ablation of the semiconductor in the regions where the gate lines pass is particularly effective. It is less effective to ablate regions of the substrate where the gate lines do not pass, and not to do so can reduce the formation of debris.

Figure 5:
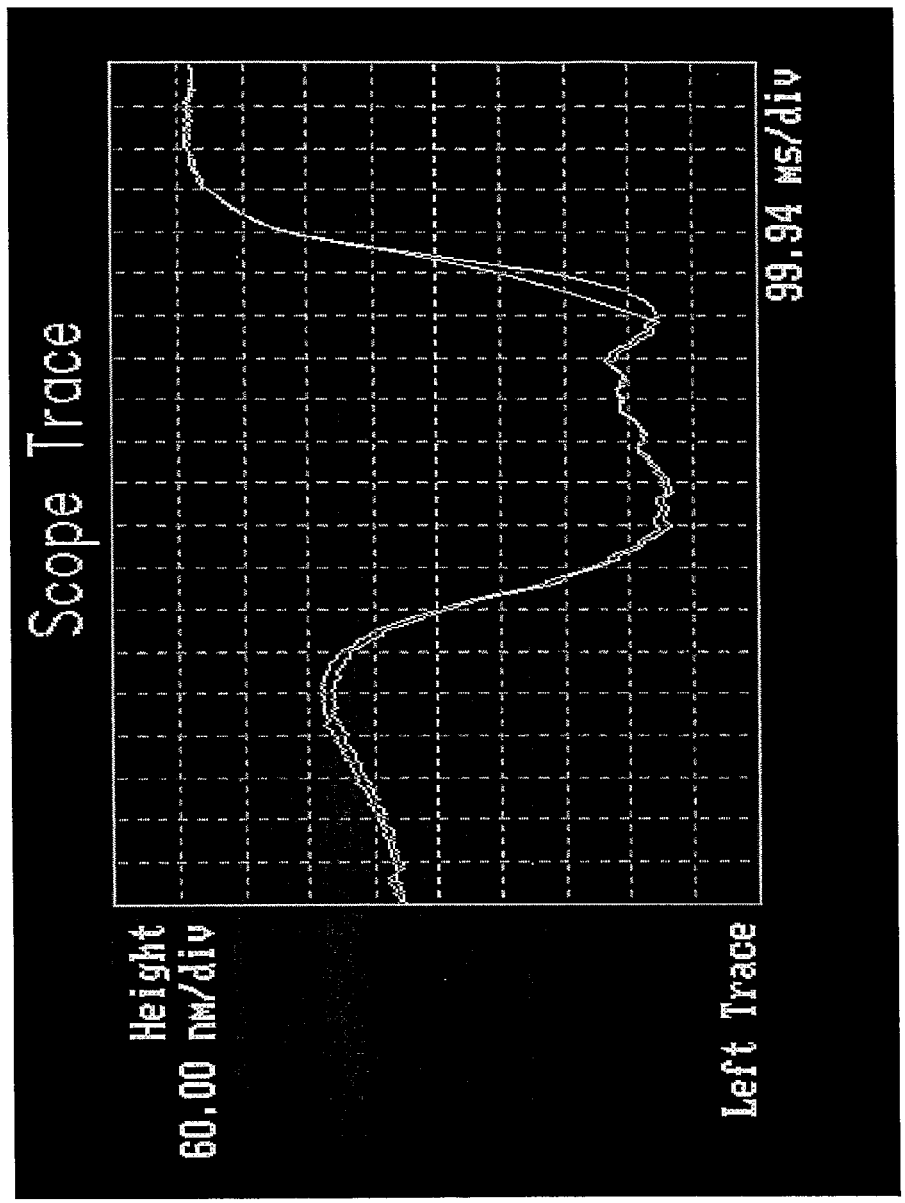
FIG. 5 shows a tapping-mode AFM height image that was taken across the ablated trench region of the device shown in FIG. 4.

A tapping-mode AFM height image is shown in FIG. 5. This image is taken across the ablated trench region 15 in FIG. 4. The image illustrates that for this experiment, the 20 μm side trench has a depth of around 300 nm. This value is greater than the thickness of the semiconductor layer which in this case was 50 nm. This overdosing approach ensures isolation of the semiconductor. However, a process could be used with a considerably lower fluence, which may result in shallower trenches, less debris and a higher process throughput. This is due to the fact that the area of the laser beam could be expanded considerably. Experiments suggest that a fluence of 100 mJ/cm$^2$ would be sufficient to ablate the semiconductor layer alone.

Figure 6:
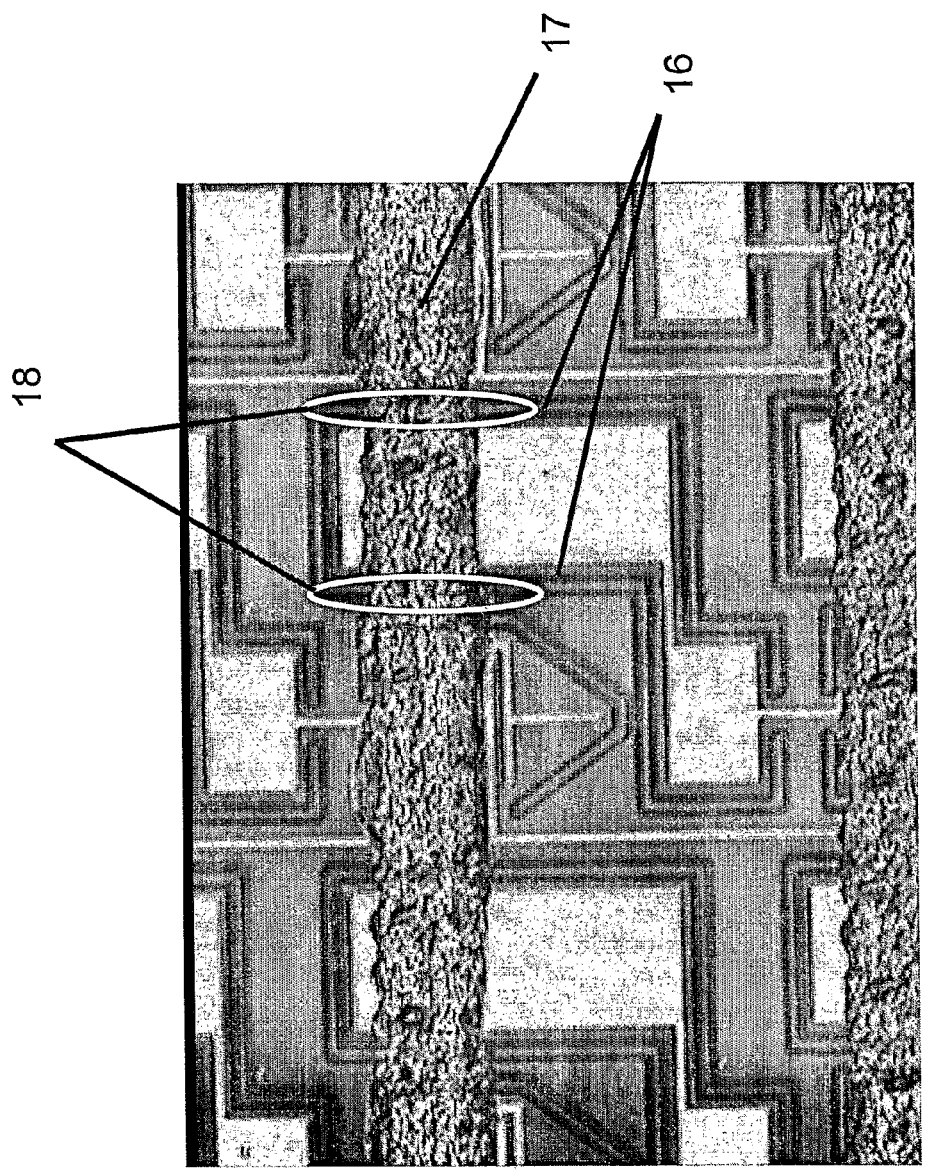
FIG. 6 shows a further optical micrograph of a device immediately after gate electrode lines have been deposited following ablation patterning of the underlying semiconductor layer according to an embodiment of the present invention.

FIG. 6 shows a further optical micrograph measured on an atomic force microscope immediately after the deposition of the gate electrode. The optical micrograph shows a laser-ablated trench 16 that has been produced around a device pixel in which a slightly different semiconductor pattern has been created. The optical micrograph shows the gate electrode 17 and the locations of the two parasitic TFT 18 that are removed by patterning the semiconductor.

The TFT characteristics were measured and shown to be unharmed by the semiconductor patterning step. However, even with the high fluence that was used in these experiments, the 'debris-affected zone' (DAZ) and heat-affected zone (HAZ) have an area of smaller than 50 μm, resulting in limited debris formation. It is expected that the above mentioned zones would be considerably smaller, probably in the region of 10 μm if a lower fluence was used, for an optimal process.

Figure 7:
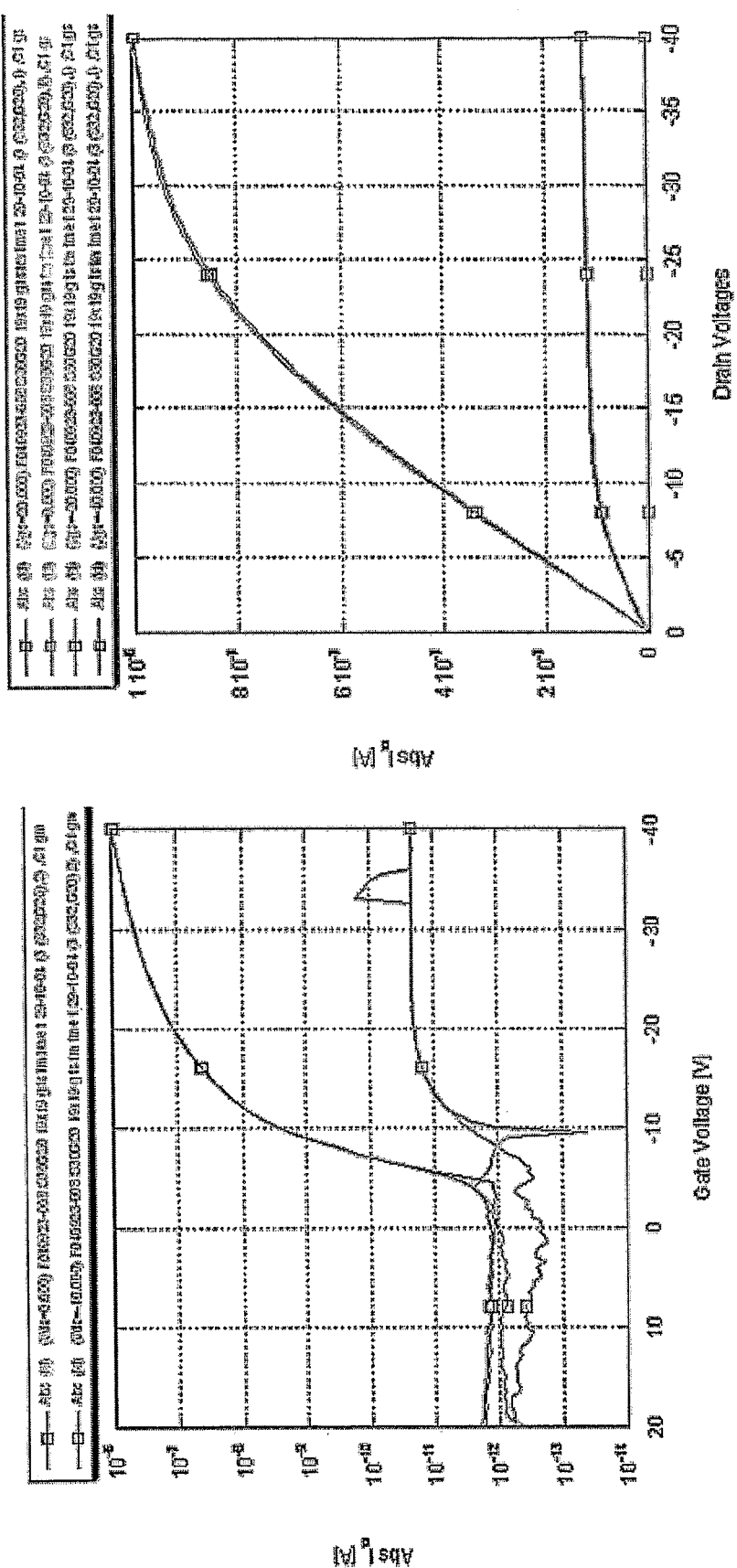
FIG. 7 illustrates typical TFT-characteristics for a semiconductor device patterned according to an embodiment of the present invention compared to those of an unpatterned semiconductor devices.

FIG. 7 shows typical TFT characteristics for the semiconductor patterning step that is shown in FIG. 4. No degradation in TFT performance compared to unpatterned semiconductor devices is observed.

Figure 8:
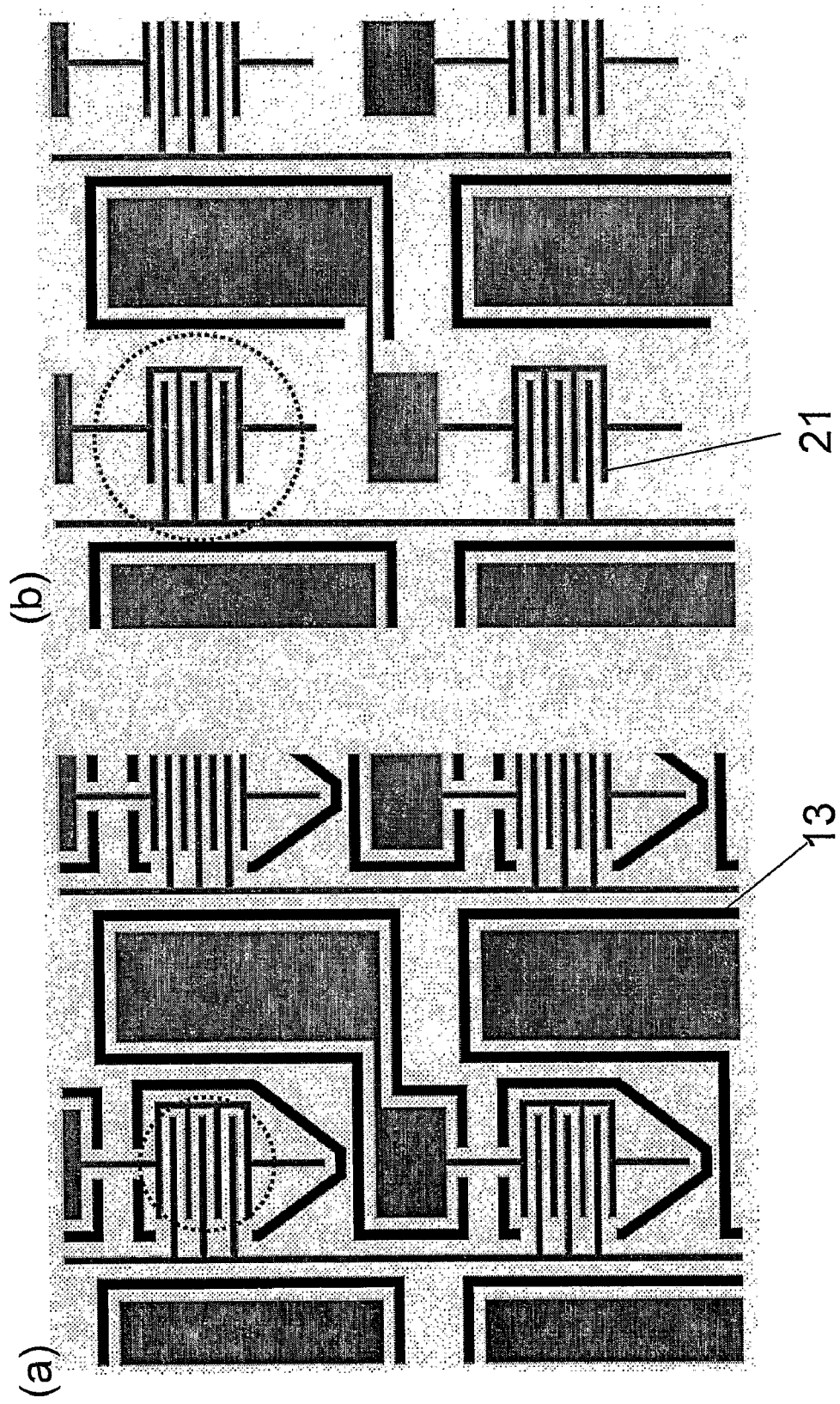

FIG. 8 shows two different examples of how the semiconductor can be patterned. In FIG. 8a, the semiconductor is patterned very close to the TFT. The minimum lateral separation of the semiconductor trench and the source or drain of the TFT in this Figure is 20 um (as shown by the dotted circle). The total area of semiconductor patterning is about 37000 (um)$^2$. In the second example of a patterning scheme, (FIG. 8b), the minimum lateral separation between the semiconductor trench and the source or drain is 60 um, and the total area of material removed is 17000 (um)$^2$, which is less than half that of FIG. 8a. Both designs were fabricated, and the semiconductor was patterned with the same overdose as before (650 mJ/cm$^2$). The semiconductor on-current for the design in FIG. 8a showed a degradation by a factor 10 compared to the design in FIG. 8b. The design in FIG. 8b showed no degradation compared to an unpatterned semiconductor sample.

Figure 9:
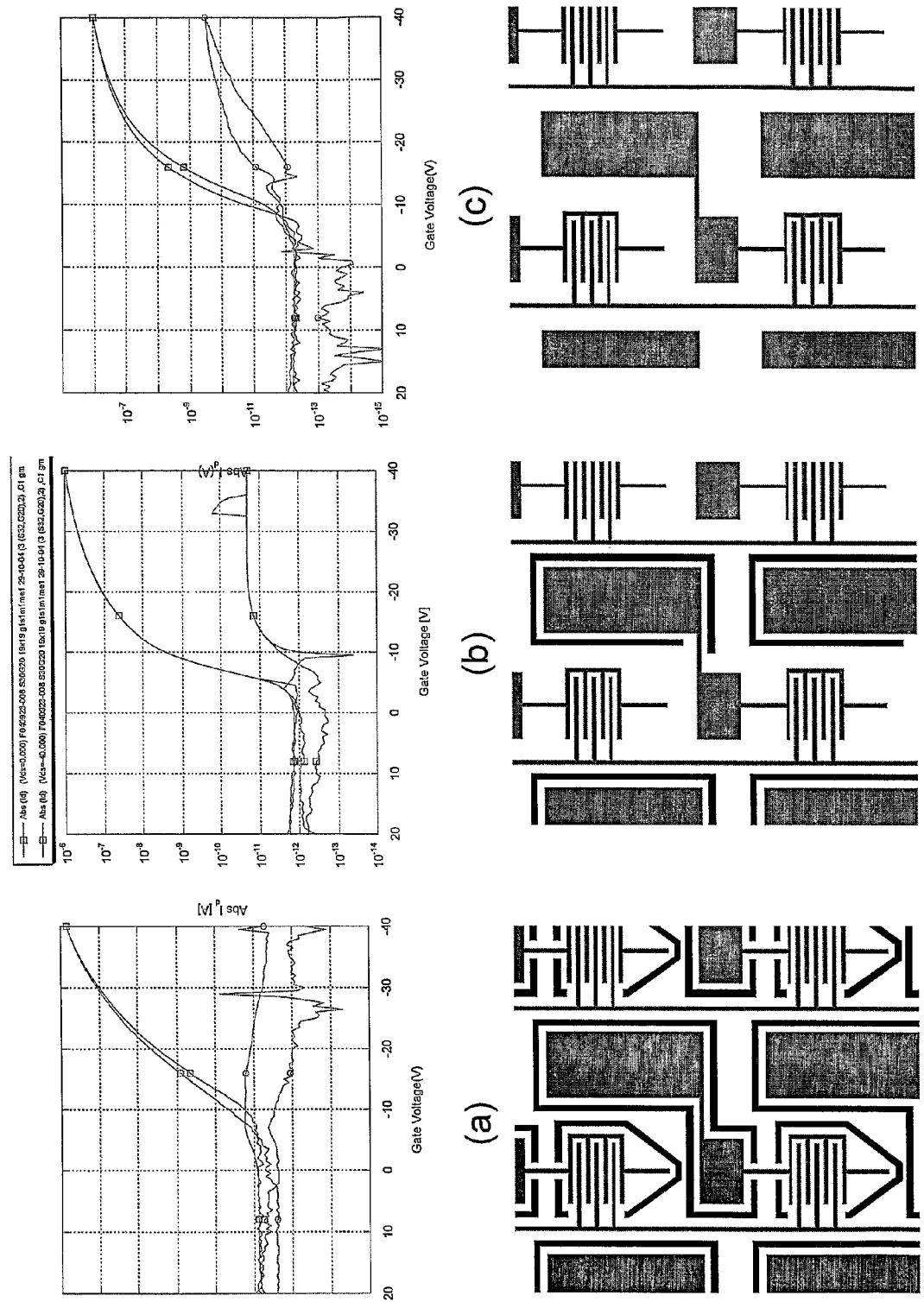
FIG. 9 shows three transfer curves for devices patterned according to embodiments of the present invention using two different designs (FIGS. 9a and 9b), compared to a sample with no semiconductor patterning (FIG. 9c).

FIG. 9 shows three transfer curves for devices patterned using two different designs (FIGS. 9a and 9b), compared to a sample with no semiconductor patterning (FIG. 9c). The 'on' current of the TFT with the most proximate patterning is lowered by a factor of 10 and the transconductance is correspondingly lower.

This shows that for this particular (high) fluence, a degradation zone exists around the patterned semiconductor whose radius is greater than 20 um but less than 60 um. The degradation zone is thought to be due to debris and thermal damage that occurs around the ablated feature. Provided that a suitable separation between TFT and semiconductor trench is maintained, there will be no device degradation, even for this high fluence of 650 mJ/cm$^2$. It is expected that the size of the degradation region will be much smaller at lower fluences, without compromising the level of device isolation.

The processes and devices described herein are not limited to devices fabricated with solution-processed polymers. For example, some of the conducting electrodes of the TFT and/or the interconnects in a circuit or display device (see below) may be formed from inorganic conductors, that are able to, for example, be deposited by the printing of a colloidal suspension or by electroplating onto a pre-patterned substrate. In devices where not all of the layers deposited from solution, one or more PEDOT/PSS portions of the device may be replaced with an insoluble conductive material such as a vacuum-deposited conductor.

Examples of possible materials that may be used for the semiconducting layer, includes any solution processable conjugated polymeric or oligomeric material that exhibits adequate field-effect mobilities exceeding 10$^{-3}$ cm$^2$/Vs and preferably exceeding 10$^{-2}$ cm$^2$/Vs. Materials that may be suitable have been previously reviewed, for example in H. E. Katz, J. Mater. Chem. 7, 369 (1997), or Z. Bao, Advanced Materials 12, 227 (2000). Other possibilities include small conjugated molecules with solubilising side chains (J. G. Laquindanum, et al., J. Am. Chem. Soc. 120, 664 (1998)), semiconducting organic-inorganic hybrid materials self-assembled from solution (C. R. Kagan, et al., Science 286, 946 (1999)), or solution-deposited inorganic semiconductors such as CdSe nanoparticles (B. A. Ridley, et al., Science 286, 746 (1999)) or inorganic semiconductor nanowires.

The electrodes may be patterned by any technique, including but not limited to photolithography, laser ablation or direct-write printing. Suitable techniques include soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999 (1997)), and photolithographic patterning (see WO 99/10939), offset printing, flexographic printing or other graphic arts printing techniques, embossing or imprinting techniques.

Although preferably all layers and components of the device and circuit are deposited and patterned by solution processing and printing techniques, one or more components may also be deposited by vacuum deposition techniques and/or patterned by photolithographic processes.

Devices such as TFTs fabricated as described above may be part of more complex circuits or devices, in which one or more such devices can be integrated with each other and/or with other devices. Examples of applications include logic circuits and active matrix circuitry for a display or a memory device, or a user-defined gate array circuit.

Patterning processes, as described above, may also be used to pattern other circuitry components, such as, but not limited to, interconnects, resistors and capacitors.

The present invention is not limited to the foregoing examples. Aspects of the present invention include all novel and inventive aspects of the concepts described herein and all novel and inventive combinations of the features described herein.

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A method of producing an array of electronic devices, the method including the steps of:
   forming one or more first conductive elements of a first electronic device on a substrate and one or more second conductive elements of a second electronic device on said substrate; and
   forming a layer of channel material over the substrate and the first and second conductive elements to provide a first channel for, in use, the movement of charge carriers between conductive elements of said first electronic device and a second channel for, in use, the movement of charge carriers between conductive elements of said second electronic device;

wherein the method also includes the step (a) of using an irradiative technique to decrease in a single step the conductivity of one or more selected portions of the layer of channel material in one or more regions between the first and second conductive elements wherein step (a) includes using an irradiative technique to remove in a single step said one or more selected portions of the layer of channel material to thereby reduce the conductivity of said one or more selected portions, and wherein said selected portions include one or more portions underlying a conductive line.

2. A method according to claim 1, wherein step (a) is carried out without irradiating any portions of the layer of channel material overlying the first and second conductive elements.

3. A method according to claim 1, wherein the channel material is a semiconductor material.

4. A method according to claim 1, wherein step (a) includes using said irradiative technique to locally generate heat in the one or more selected portions of the layer of channel material in between first and second conductive elements and/or respective portions of the substrate underlying said one or more selected portions of the layer of channel material, wherein said heat induces a photothermal and/or photochemical denaturing process of the channel material and acts to reduce the conductivity of said one or more selected portions of the layer of channel material.

5. A method according to claim 1 wherein said step (a) involves ablating said portions of the channel material.

6. A method according to claim 5 wherein the step of ablating said portions of the channel material uses ultraviolet laser radiation.

7. A method according to claim 5, wherein said step of ablating the channel material also ablates a portion of the material of the substrate.

8. A method according to claim 1, wherein said one or more selected portions in step (a) include one or more lines extending substantially perpendicular to a direction between said first and second conductive elements.

9. A method according to claim 1, wherein the method includes forming a pair of first conductive elements and a pair of second conductive elements on the substrate; and wherein the layer of channel material provides said first channel between said pair of first conductive elements, and said second channel between said pair of second conductive elements.

10. A method according to claim 9, wherein the region in which said selected portions of said layer of channel material are spaced more than 10 micrometers from said first and second channels.

11. A method according to claim 9, wherein said selected portions of said layer of channel material are spaced more than 50 micrometers from said first and second channels.

12. A method according to claim 9, wherein said selected portions of said layer of channel material are spaced more than 10 micrometers from said first and second conductive elements.

13. A method according to claim 9, wherein the region in which said selected portions of said channel material are spaced more than 50 micrometers from said first and second conductive elements.

14. A method according to claim 9, wherein the first pair of conductive elements forms the source and drain electrodes of a first field effect transistor device, and the second pair of conductive elements forms the source and drain electrodes of a second field effect transistor device.

15. A method according to claim 14, further including the steps of
(b) forming a dielectric layer over the substrate, the first and second conductive elements and the layer of channel material; and
(c) forming a gate line extending over each of the first and second channels.

16. A method according to claim 15, wherein the first and second electronic devices are normally-off field effect transistor devices, and wherein said one or more selected portions of step (a) include portions underlying said gate line.

17. A method according to claim 15, wherein said gate line has a width, and the one or more selected portions of step (a) include one or more lines extending at least the width of said gate line.

18. A method according to claim 15, wherein the first and second electronic devices are normally-on field effect transistor devices, wherein said one or more selected portions of step (a) include (i) portions underlying said gate line and (ii) portions not underlying said gate line.

19. A method according to claim 18, wherein the one or more first conductive elements include a pixel electrode having a number of sides, and wherein the one or more selected portions in step (a) include one or more lines extending along each of the sides of the pixel electrode.

20. A method according to claim 1, wherein said one or more selected portions in step (a) include a series of at least two lines extending continuously under a gate line.

21. A method according to claim 1, wherein step (a) includes focussing one or more laser beams to one or more points located in said one more selected portions of the layer of channel material or respective portions of the substrate underlying said one or more selected portions.

22. An array of electronic devices produced by a method according to claim 1.

23. A display or memory device including an array of electronic devices according to claim 22.

24. A method of producing an array of electronic devices, the method including the steps of:

forming one or more first conductive elements of a first electronic device on a substrate and one or more second conductive elements of a second electronic device on said substrate; and forming a layer of channel material over the substrate and the first and second conductive elements to provide a first channel for, in use, the movement of charge carriers between conductive elements of said first electronic device and a second channel for, in use, the movement of charge carriers between conductive elements of said second electronic device;

wherein the method also includes the step (a) of using an irradiative technique to decrease in a single step the conductivity of one or more selected portions of the layer of channel material in one or more regions between the first and second conductive elements, wherein the one or more first conductive elements include a conductive element having a number of sides, and wherein the one or more selected portions in step (a) include one or more lines extending along at least two sides of said conductive element having a number of sides.

* * * * *